US012618877B2

(12) United States Patent
Han et al.

(10) Patent No.: US 12,618,877 B2
(45) Date of Patent: May 5, 2026

(54) CURRENT SENSOR APPARATUS

(71) Applicant: Honeywell International Inc., Charlotte, NC (US)

(72) Inventors: Liansheng Han, Charlotte, NC (US); Chao Yu, Charlotte, NC (US); Haiyang Li, Charlotte, NC (US); Lei Ai, Charlotte, NC (US); Jun Wang, Charlotte, NC (US); Fan Yang, Charlotte, NC (US)

(73) Assignee: Honeywell International Inc., Charlotte, NC (US)

( * ) Notice: Subject to any disclaimer, the term of this patent is extended or adjusted under 35 U.S.C. 154(b) by 256 days.

(21) Appl. No.: 18/329,945

(22) Filed: Jun. 6, 2023

(65) Prior Publication Data

US 2023/0408553 A1     Dec. 21, 2023

(30) Foreign Application Priority Data

Jun. 20, 2022    (CN) .......................... 202210696721.5

(51) Int. Cl.
*G01R 15/18* (2006.01)
*G01R 15/20* (2006.01)

(52) U.S. Cl.
CPC ......... *G01R 15/183* (2013.01); *G01R 15/202* (2013.01)

(58) Field of Classification Search
CPC ..... G01R 15/183; G01R 15/202; G01R 19/25
USPC .......................... 324/117 H, 117 R, 126, 127
See application file for complete search history.

(56) References Cited

U.S. PATENT DOCUMENTS

| | | | |
|---|---|---|---|
| 5,309,086 A * | 5/1994 | Johansson ............ | G01R 15/185 |
| | | | 324/117 R |
| 2009/0295384 A1 | 12/2009 | Teppan | |
| 2020/0141981 A1* | 5/2020 | Hurwitz ................ | H01F 27/288 |
| 2021/0118610 A1* | 4/2021 | Sun .......................... | H01F 27/29 |
| 2022/0099707 A1* | 3/2022 | Buhlmann .............. | H01F 27/24 |
| 2023/0384351 A1* | 11/2023 | Saito ..................... | H01F 27/366 |

FOREIGN PATENT DOCUMENTS

| | | |
|---|---|---|
| CN | 113970663 A | 1/2022 |
| WO | 2022/092027 A1 | 5/2022 |

OTHER PUBLICATIONS

Extended European Search Report Mailed on Nov. 7, 2023 for EP Application No. 23175727, 9 page(s).

(Continued)

*Primary Examiner* — Arleen M Vazquez
*Assistant Examiner* — Robert P Alejnikov, Jr.
(74) *Attorney, Agent, or Firm* — Alston & Bird LLP

(57) ABSTRACT

Current sensors and components for measuring electrical current are provided. The current sensor component comprises a wire coil wrapped around a core and a pinboard coupled to the wire coil. The pinboard comprises a holder mounted on at least a portion of the wire coil and a pair of metal pins, wherein first ends of the pair of metal pins are coupled to the wire coil and configured to receive a voltage signal from the wire coil, and second ends of the pair of metal pins are coupled to an interface of a circuit board and configured to transfer the voltage signal from the wire coil to the circuit board.

16 Claims, 6 Drawing Sheets

(56) References Cited

OTHER PUBLICATIONS

Sonnecy, "Closed Loop AC/DC Hall Current Sensor CYHCS-EC, Output: 1mA ~ 100mA, Power Supply: ±12V ~ ±18V, Window: 8.5mm", retrieved from the Internet at URL: <https://www.sonnecy-shop.com/en/closed-loop-ac/dc-hall-current-sensor-cyhcs-ec-output-1ma-100ma-power-supply-12v-18v-window-8.5mm.html> on Nov. 6, 2023, 3 pages.

Xiamen ZT Technology Co., Ltd., "CSM100EE Closed Loop Hall Effect Current Sensors", retrieved from the Internet at URL: <https://www.zntar.com/-closed-loop-hall-current-transducer/750-csm100ee-closed-loop-hall-effect-current-sensors.html> on Nov. 6, 2023, 1 page.

Intention to grant Mailed on Oct. 27, 2025 for EP Application No. 23175727, 6 page(s).

* cited by examiner

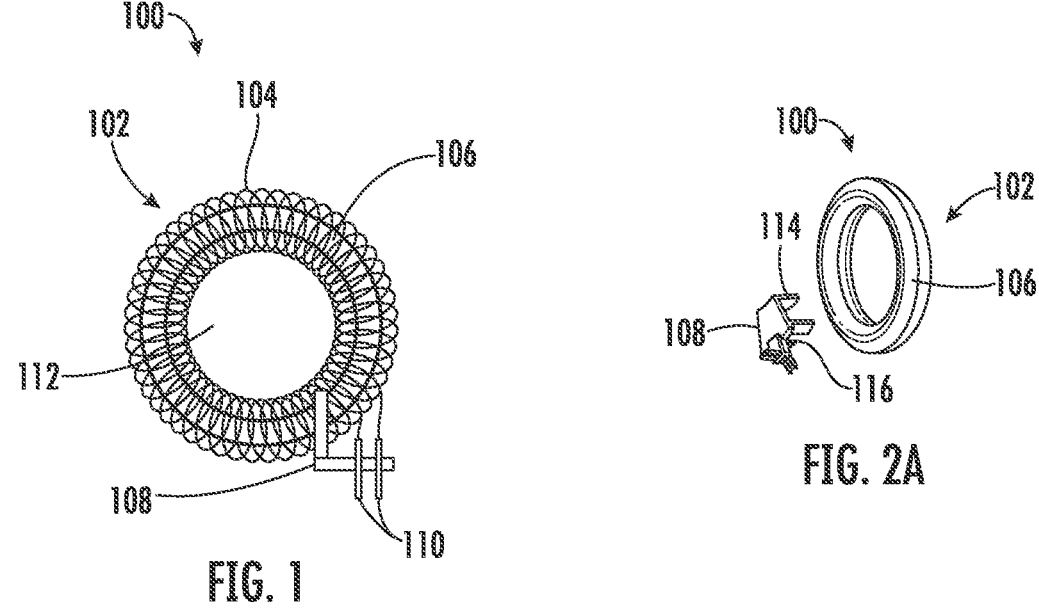
FIG. 1
FIG. 2A
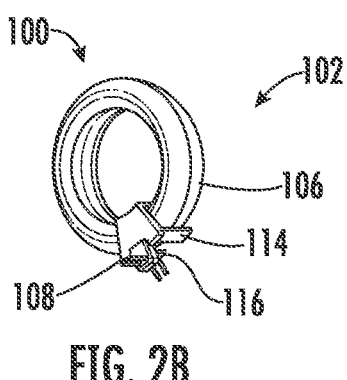
FIG. 2B

CURRENT SENSOR APPARATUS

CROSS-REFERENCE TO RELATED APPLICATIONS

This application claims priority pursuant to 35 U.S.C. 119(a) to Chinese Application No. 202210696721.5, filed Jun. 20, 2022, which application is incorporated herein by reference in its entirety.

FIELD OF THE INVENTION

Example embodiments of the present disclosure relate generally to current sensors, and in particular, improved current sensor elements and components.

BACKGROUND

Current sensors are employed in many industrial and automotive applications, such as battery management systems. In order to obtain detailed information about state of health and state of charge of battery, integrating accurate sensors into a battery monitoring system is critical. Current sensors may be employed to measure the current flowing into (when charging) and out of (when discharging) the battery. Applicant has identified many technical challenges and difficulties associated with conventional current sensors.

BRIEF SUMMARY

Various embodiments described herein relate to components, apparatuses, and systems for measuring electrical current.

In accordance with various embodiments of the present disclosure, a component of a current sensor apparatus is provided. In some embodiments, the component comprises a wire coil wrapped around a core and a pinboard coupled to the wire coil. The pinboard comprises a holder mounted on at least a portion of the wire coil and a pair of metal pins, wherein first ends of the pair of metal pins are coupled to the wire coil and configured to receive a voltage signal from the wire coil, and second ends of the pair of metal pins are coupled to an interface of a circuit board and configured to transfer the voltage signal from the wire coil to the circuit board.

In some embodiments, the first ends of the pair of metal pins may comprise contacts configured for contacting with opposing ends of the wire coil. In some embodiments, at least two surfaces of the holder may be in contact with the wire coil. In some embodiments, the holder may comprise a fixture that maintains at least the wire coil in a fixed position within a housing. In some embodiments, the holder may further comprise a clamp. In some embodiments, the circuit board may be configured to generate a digital output corresponding to the voltage signal.

According to another embodiment, a current sensor is provided. In some embodiments, the current sensor comprises a coil current sensor element including a wire coil wrapped around a core material, a circuit board including one or more components configured to process a voltage signal from the coil current sensor element, and a pinboard coupled to the coil current sensor element. The pinboard comprises a holder mounted on at least a portion of the wire coil, and a pair of metal pins configured about a wire coil of the coil current sensor element, wherein the pair of metal pins are configured to transfer the voltage signal from the coil current sensor element to the one or more components of the circuit board. The current sensor may further comprise a housing encapsulating the coil current sensor element, the circuit board, and the pinboard.

In some embodiments, the one or more components of the circuit board may comprise at least one voltage signal processing device. In some embodiments, the circuit board may be configured to generate a digital output corresponding to the voltage signal. In some embodiments, the holder may comprise a fixture that maintains at least the coil current sensor element in a fixed position within the housing. In some embodiments, the pair of metal pins may comprise contacts configured for contacting with opposing ends of the wire coil. In some embodiments, at least two surfaces of the holder may be in contact with the wire coil.

According to yet another embodiment, the current sensor comprises an open-loop current sensor element and a Hall-effect sensor coupled to the open-loop current sensor element. The Hall-effect sensor may be configured to generate a first output based on operation of the open-loop current sensor element. The current sensor further comprises a coil current sensor element configured to generate a second output. The coil current sensor element includes a pinboard comprising a holder mounted on at least a portion of the coil current sensor element, and a pair of metal pins configured about a wire coil of the coil current sensor element. The current sensor further comprises a circuit board coupled to the Hall-effect sensor at a first location and coupled to the coil current sensor element via the pair of metal pins at a second location, wherein the circuit board is configured to generate a digital output based on at least one of the first output and the second output, wherein the first location is orthogonally non-overlapping with respect to the second location.

In some embodiments, the first location may comprise a first quadrant and the second location may comprise a second quadrant. In some embodiments, the first location may comprise at least a 90° angle of rotation away from the second location. In some embodiments, the holder may comprise a fixture that maintains at least the wire coil in a fixed position within a housing. In some embodiments, the holder may further comprise a clamp. In some embodiments, the digital output may comprise a current reading corresponding to at least one of the first output and the second output. In some embodiments, the pair of metal pins may comprise contacts configured for contacting with opposing ends of the wire coil. In some embodiments, at least two surfaces of the holder may be in contact with the wire coil.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which:

FIG. 1 illustrates a top view of an example current sensor component in accordance with various embodiments of the present disclosure.

FIG. 2A and FIG. 2B illustrate perspective views of an example current sensor component in accordance with various embodiments of the present disclosure.

Figure 3A:
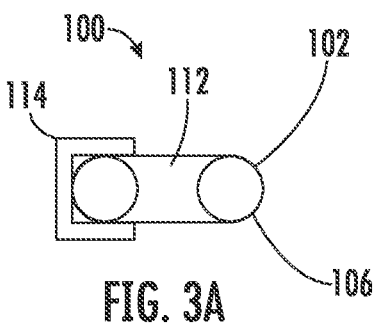
Figure 3B:
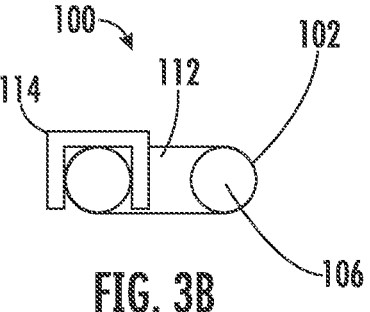

FIG. 3A and FIG. 3B illustrate top-down cross-sectional views of exemplary pinboard configurations in accordance with various embodiments of the present disclosure.

Figure 4:
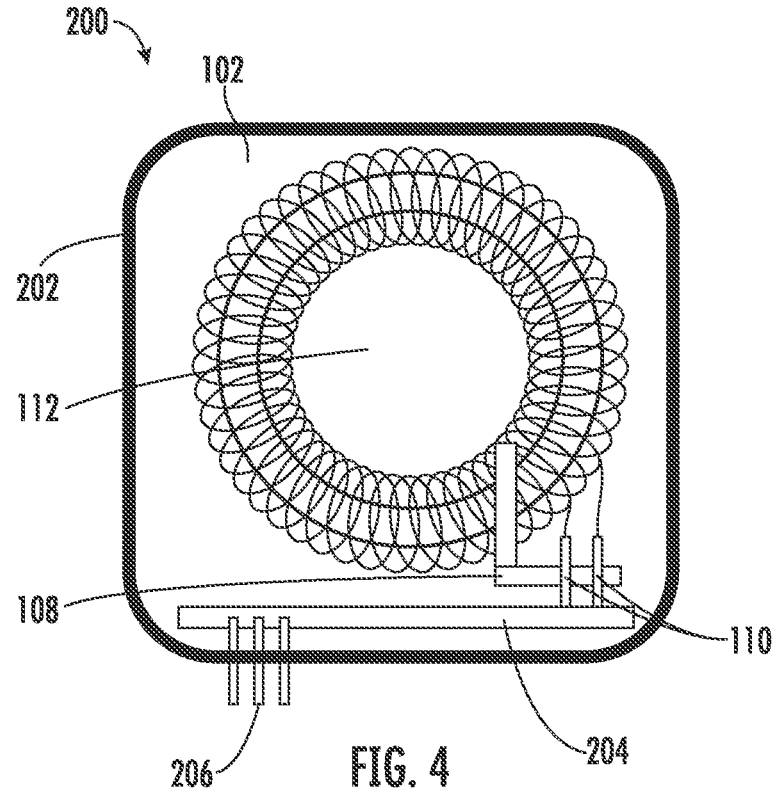

FIG. 4 illustrates an exposed view of an example current sensor in accordance with various embodiments of the present disclosure.

Figure 5:
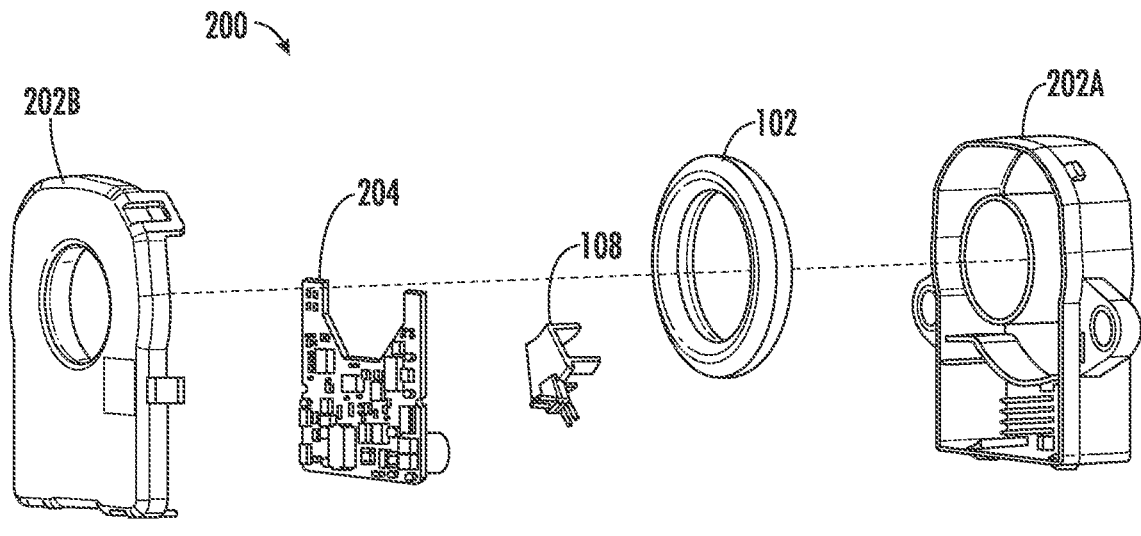

FIG. 5 illustrates an exploded view of an example current sensor in accordance with various embodiments of the present disclosure.

Figure 6A:
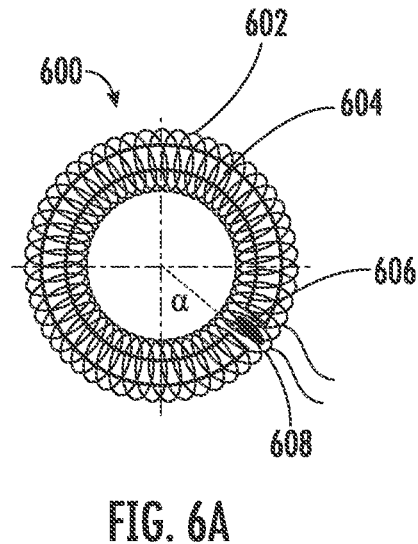

FIG. 6A illustrates an exemplary orientation of a coil current sensor component in accordance with various embodiments of the present disclosure.

Figure 6B:
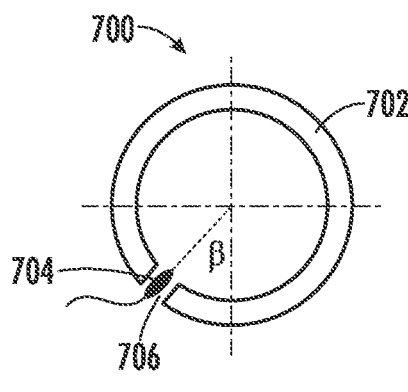

FIG. 6B illustrates an exemplary orientation of an open-loop current sensor component in accordance with various embodiments of the present disclosure.

Figure 7:
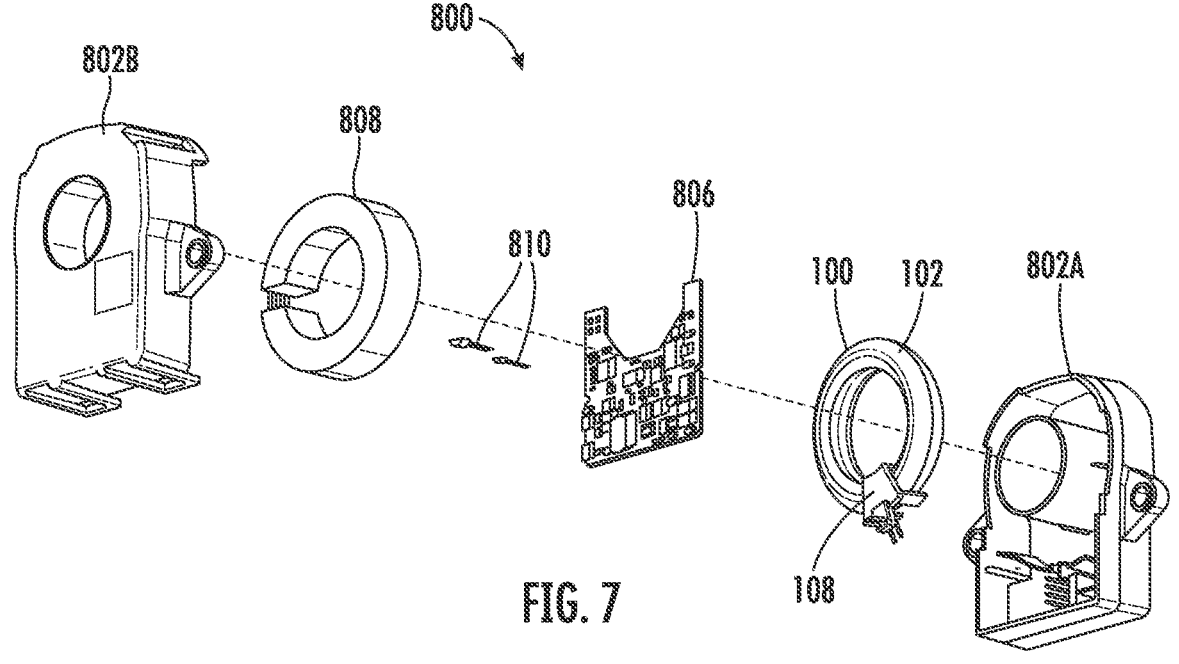

FIG. 7 illustrates an exploded view of an example current sensor in accordance with various embodiments of the present disclosure.

DETAILED DESCRIPTION OF THE INVENTION

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

Along with electronics and semiconductor device, current sensors are widely used in power systems. As described above, there are many technical challenges and difficulties associated with current sensors. An open-loop current sensor may include a magnetic core that is designed with an air gap in which a Hall-effect sensor is placed. However, the air gap is one of the key factors which can affect the sensitivity and accuracy of Hall-effect-based current sensors. Additionally, coil-based current sensors may employ a coil that is wound around a core to receive a magnetic field that induces voltage via magnetic flux produced at the coil. However, deformation (e.g., lack of uniformity/misalignment/lack of uniform coil winding) of the coil winding can affect current sensor performance.

Also, current sensors may employ both coil-based current sensor circuitry (e.g., for measurement of low current range) and open-loop current sensor circuitry (e.g., for measurement of high current range) to provide high accuracy current measurement for a broad range of currents as well as to provide redundant current sensing flexibility. However, in such an application, there may be interferences between the coil-based and open-loop circuitries, which may affect the sensor's performance. As such, there is a need to remove/reduce the interferences between co-existing coil-based and open-loop circuitries within a current sensor in order to improve sensor performance.

Various example embodiments of the present disclosure overcome such technical challenges and difficulties in current sensors, and provide various technical advancements and improvements. In accordance with various examples of the present disclosure, components of example current sensor components for improving current sensor performance are disclosed.

Referring now to FIG. 1, a current sensor component 100 is provided, which may be used in accordance with various embodiments of the present disclosure. In some embodiments, current sensor component 100 comprises a coil current sensor element 102 including a wire coil 104 wrapped around a core 106.

The wire coil 104 may comprise a helical coil of wire wound about a tube body of wire coil 104. In some embodiments, the wire coil 104 is wrapped around the core 106. For example, the wire coil 104 may comprise an N number of turns around an entirety of the tube body of wire coil 104. The wire coil 104 may include a first lead at a first end of the wire coil 104 and second lead at a second end of the wire coil. The wire coil 104 may comprise copper or any metal suitable for conducting an electrical current.

In some embodiments, the current sensor component 100 further comprises a pinboard 108 coupled to the wire coil 104. The pinboard 108 comprises a pair of metal pins 110 and a holder 114 that may be mounted on at least a portion of the wire coil 104. The pair of metal pins 110 may comprise contacts or leads made from conductive metal, such as copper, nickel, silver, gold, or any alloys thereof. The pair of metal pins 110 may be coupled to the holder 114 via a bracket, clip, or similar attachments. A first one of the pair of metal pins 110 may be coupled to the first lead of the wire coil 104 and a second one of the pair of metal pins 110 may be coupled to the second lead of the wire coil 104. The first ends of the pair of metal pins 110 may comprise contacts configured for contacting with each of opposing ends of the wire coil 104.

The core 106 may comprise a torus, or colloquially known as a donut or doughnut, shape including a ring portion and an inner void. In other embodiments, the core 106 may comprise a quadrate shape. In some embodiments, the core 106 may comprise ferromagnetic materials, such as nanocrystalline and ferronickel materials (e.g., a toroid core). According to other embodiments, the core 106 may comprise a non-metal core or an air core (e.g., a nonmagnetic core comprising fiber or plastic). In some embodiments, the core 106 may be in a shape similar to a torus shape.

In accordance with some embodiments, the coil current sensor element 102 may comprise a Rogowski coil current sensor. In other embodiments, the coil current sensor element 102 may comprise a closed-loop hall-effect current sensor.

Coil current sensor element 102 further defines an aperture 112 within the inner void of core 106. The aperture 112 may be configured for detection of a current through indirect sensing. For example, a conductor carrying a current may be placed through aperture 112 which may produce a magnetic flux at wire coil 104. The magnetic flux may induce electromotive force (emf), measured in voltage, in wire coil 104 according to Faraday's law of induction.

The first ends of the pair of metal pins 110 may be configured to receive and conduct a voltage signal from the wire coil 104. The second ends of the pair of metal pins 110 may be coupled to an interface of a circuit board and configured to transfer raw voltage signals from the wire coil 104 to the circuit board. Voltage signals from the wire coil 104 may be processed by the circuit board to generate a digital output signal that is proportional to magnetic flux received by the wire coil 104 at the aperture 112. The circuit board may include an analog to digital converter for converting the voltage signal into the digital output signal. For example, the digital output signal may be representative of a current calculated based on the voltage signal and a measurement resistor using Ohm's law (voltage=electrical current×resistance).

According to embodiments of the present disclosure, the holder 114 may provide a protective fixture to protect the structure of the wire coil 104 when current sensor component 100 is placed within a housing. For example, the holder 114 may comprise a rigid body for shielding at least a portion of wire coil 104 from physical damage. According to some embodiments, the holder 114 may be used to cover sensitive portions of a current sensor component. For example, a current sensor component may include a portion comprising a Hall-sensor and air gap that may be positioned within the holder 114.

The holder 114 may also maintain at least the wire coil 104 and core 106 in a fixed position when placed in a housing. Referring to FIG. 2A and FIG. 2B, the pinboard 108 may comprise a holder 114 that is configured to clamp around at least a portion of coil current sensor element 102 to restrict movement of the wire coil 104 and core 106 within the holder 114. The pinboard 108 further includes an anchor 116. The anchor 116 may comprise an attachment to a housing such that holder 114 may be stabilized within the housing. As such, the holder may prevent shifting and jostling of the wire coil 104 and core 106 within the housing.

The holder 114 comprises three sidewalls including a C-shaped profile and a void bounded by the three sidewalls. The sidewalls of the holder 114 may be placed over wire coil 104 around at least a portion of the core 106. That is, at least a portion of the core 106 wrapped by the wire coil 104 may be configured to occupy the void bounded by the three sidewalls of the holder 114. As depicted in FIG. 3A and FIG. 3B, sidewall surfaces of holder 114 are in contact with the coil current sensor element 102. A cross section of the coil current sensor element 102 is represented by two circles connected by two parallel lines. In some embodiments, the sidewall surfaces may be in contact with wire coil 104 that is wrapped over a portion of core 106. At least two of the sidewall surfaces of holder 114 may be in contact with the coil current sensor element 102. For example, three sidewall surfaces of holder 114 are in contact with coil current sensor element 102, as shown in FIG. 3A. In another example, two sidewall surfaces of holder 114 are in contact with coil current sensor element 102, as shown in FIG. 3B.

FIG. 3A shows a configuration of the holder 114 where the sidewall surfaces are positioned on the outer surfaces of the coil current sensor element 102 such that the center one of the sidewall surfaces is positioned on a side of the coil current sensor element 102 opposing the aperture 112. Alternatively, holder 114 may be positioned such that one of non-center sidewall surfaces of the holder 114 is positioned on a side of the coil current sensor element 102 adjacent to the aperture 112, as shown in FIG. 3B.

FIG. 4 presents an exposed view of an example current sensor according to various embodiments described herewith. A current sensor 200 comprises a housing 202 encapsulating coil current sensor element 102, pinboard 108, and a circuit board 204. Pinboard 108 is coupled to the coil current sensor element 102. The pinboard 108 may hold the coil current sensor element 102 in place within housing 202 and provide a protective covering over at least a portion of the wire coil 104. That is, the pinboard 108 may provide a fixture that maintains at least the coil current sensor element 102 in a fixed position within the housing 202. According to some embodiments, housing 202 may comprise a clamshell housing which is described in further detail with respect to the description of FIG. 5.

The pair of metal pins 110 may comprise contacts that are configured about the wire coil 104 of the coil current sensor element 102. In particular, the pair of metal pins 110 is coupled to ends of wire coil 104 such that the pair of metal pins 110 can transfer an output comprising a voltage signal from the coil current sensor element 102 to one or more components of the circuit board 204. The circuit board 204 may include a processing device and an analog to digital converter for converting the voltage signal into a digital output signal. The digital output signal may be representative of a current that is proportional to a magnetic flux detected by coil current sensor element 102.

FIG. 5 illustrates an exploded view of an example current sensor in accordance with some example embodiments of the present disclosure. In the illustrated embodiment, current sensor 200 comprises coil current sensor element 102, pinboard 108, and circuit board 204, all enclosed within housing portion 202A and housing portion 202B. The coil current sensor element 102 may be inserted within a retaining receptacle in housing portion 202A. Pinboard 108 may be attached to the coil current sensor element 102 on a side opposite-facing the housing portion 202A. The pinboard 108 may be further secured the housing portion 202A to anchor the coil current sensor element 102 in place within the housing portion 202A. Circuit board 204 is positioned adjacently to housing portion 202B and is coupled to the pinboard 108.

In various embodiments of the present disclosure, a current sensor may employ both a coil current sensor element and an open-loop current sensor element to provide high accuracy current measurement for a broad range of currents as well as to provide redundant current sensing flexibility. That is, the coil current sensor and open-loop current sensor elements may be arranged in parallel and homocentric to each other within a single housing. However, in such a configuration, interference may exist between the coil current sensor and open-loop current sensor elements, which may affect the sensor's performance. To alleviate interference, the coil current sensor and open-loop current sensor elements may be orientated such that signal sensitive components of various types of sensors, such as leads or interfaces 206 with the circuit board 204, Hall-effect sensors, and magneto resistive sensors, do not overlap.

Referring to FIG. 6A, a coil current sensor element 600 comprises a wire coil 602 wrapped around a core 604. The coil current sensor element 600 further comprises a Hall-effect sensor 606 within an air gap 608 of core 604. In some embodiments of the present disclosure, the Hall-effect sensor 606 may be substituted with a pinboard 108. FIG. 6B presents an open-loop current sensor element 700 according to some embodiments of the present disclosure. The open-loop current sensor element 700 comprises a magnetic core 702 and a Hall-effect sensor 704 within an air gap 706 of magnetic core 702.

In various embodiments of the present disclosure, a current sensor may comprise a combination of coil current sensor element 600 and open-loop current sensor element 700. That is, coil current sensor element 600 and open-loop current sensor element 700 may be arranged in parallel and homocentric to each other within a single housing as shown in FIG. 7. To alleviate interference between Hall-effect sensor 606 (or pinboard 108 covering Hall-effect sensor 606 in some embodiments) and Hall-effect sensor 704, they may be positioned in different locations.

Hall-effect sensor 606 may be configured in a first location of a housing and the Hall-effect sensor 704 may be configured in a second location of the housing, wherein the first location is orthogonally non-overlapping with respect to the second location. In various embodiments of the present disclosure, Hall-effect sensor 606 and Hall-effect sensor 704 may be configured in different quadrants of a Cartesian plane. According to the embodiment illustrated in FIG. 6, Hall-effect sensor 606 is positioned in a α quadrant location while Hall-effect sensor 704 is positioned in a β quadrant location. According to one embodiment, the first position may be at least a 90° angle of rotation (e.g., on a Cartesian plane) away from the second location.

FIG. 7 presents a current sensor according to various embodiments described herewith. Current sensor 800 comprises current sensor component 100, a circuit board 806, Hall-effect sensor components 810, and magnetic core 808, all enclosed within housing portion 802A and housing portion 802B. The coil current sensor element 102 of current sensor component 100 may be inserted within a retaining receptacle in housing portion 802A.

Pinboard 108 may be attached to the coil current sensor element 102 on a side opposite-facing the housing portion 802A. The pinboard 108 may be further secured the housing portion 802A to anchor the coil current sensor element 102 in place within the housing portion 802A. The pinboard 108 may include a holder 114 that clamps the coil current sensor element 102 and an anchor 116 that holds the coil current sensor element 102 in place within housing portion 802A. Holder 114 may further comprise a rigid body that provides a protective covering over at least a portion of wire coil over the coil current sensor element 102 (or Hall-effect sensor

606 of coil current sensor element 600 in some embodiments). According to various embodiments of the present disclosure, at least two surfaces of the holder 114 are in contact with the wire coil portion.

Circuit board 806 is positioned between current sensor component 100 and magnetic core 808. The circuit board 806 may be coupled to pinboard 108 via a pair of metal pins for transferring output comprising a voltage signal from the coil current sensor element 102 to one or more components of the circuit board 806. The pair of metal pins may comprise contacts configured for contacting with opposing ends of the wire coil of coil current sensor element 102.

Hall-effect sensor components 810 may be configured between an air gap of magnetic core 808 thereby forming an open-loop current sensor element as described above. The circuit board 806 may be coupled to the Hall-effect sensor components 810 to receive output comprising a voltage signal from the open-loop current sensor element formed by magnetic core 808 and Hall-effect sensor components 810.

The circuit board 806 may be coupled to the Hall-effect sensor components 810 at a first location and coupled to the pinboard 108 at a second location, wherein the first location is orthogonally non-overlapping with respect to the second location thereby preventing interference as discussed above. The circuit board 806 may include a processing device and an analog to digital converter for converting voltage signals from, for example, pinboard 108 and Hall-effect sensor components 810, into digital output signals. The digital output signals may be representative of a current reading measured by the open-loop current sensor element formed by magnetic core 808 and Hall-effect sensor components 810, and a current reading measured by current sensor component 100, respectively. For example, a given digital output signal may be representative of a current calculated based on a voltage signal and a measurement resistor using Ohm's law. The circuit board 806 may be configured to generate a digital output based on output from at least one or a combination of the pinboard 108 and Hall-effect sensor components 810.

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

What is claimed is:

1. A current sensor component comprising:
   a wire coil wrapped around a core; and
   a pinboard coupled to the wire coil, wherein the pinboard comprises:
   a holder coupled at a first end of the pinboard, wherein the holder is configured to clamp around at least a portion of the wire coil, wherein at least two surfaces of the holder are in contact with the wire coil;
   an anchor coupled to the pinboard, wherein the anchor is configured to engage with a housing to stabilize the pinboard within the housing; and
   a pair of metal pins coupled at a second end of the pinboard, wherein:
   first ends of the pair of metal pins are coupled to the wire coil and configured to receive a voltage signal from the wire coil; and
   second ends of the pair of metal pins are coupled to an interface of a circuit board and configured to transfer the voltage signal from the wire coil to the circuit board, wherein the first end and the second end of the pinboard are diametrically opposite.

2. The current sensor component of claim 1 wherein the first ends of the pair of metal pins comprise contacts configured for contacting with opposing ends of the wire coil.

3. The current sensor component of claim 1 wherein the holder comprises a fixture that maintains at least the wire coil in a fixed position within a housing.

4. The current sensor component of claim 1 wherein the holder further comprises a clamp.

5. The current sensor component of claim 1 wherein the circuit board is configured to generate a digital output corresponding to the voltage signal.

6. A current sensor comprising:
a coil current sensor element including a wire coil wrapped around a core material;
a circuit board including one or more components configured to process a voltage signal from the coil current sensor element;
a pinboard coupled to the coil current sensor element, wherein the pinboard comprises:
a holder coupled at a first end of the pinboard, wherein the holder is configured to clamp around at least a portion of the wire coil, wherein at least two surfaces of the holder are in contact with the wire coil;
an anchor coupled to the pinboard, wherein the anchor is configured to engage with a housing to stabilize the pinboard within the housing; and
a pair of metal pins coupled at a second end of the pinboard, wherein the pair of metal pins is configured about the wire coil of the coil current sensor element, the pair of metal pins configured to transfer the voltage signal from the coil current sensor element to the one or more components of the circuit board, wherein the first end and the second end of the pinboard are diametrically opposite; and
a housing encapsulating the coil current sensor element, the circuit board, and the pinboard.

7. The current sensor of claim 6 wherein the one or more components of the circuit board comprise at least one voltage signal processing device.

8. The current sensor of claim 6 wherein the circuit board is configured to generate a digital output corresponding to the voltage signal.

9. The current sensor of claim 6 wherein the holder comprises a fixture that maintains at least the coil current sensor element in a fixed position within the housing.

10. The current sensor of claim 6 wherein the pair of metal pins comprise contacts configured for contacting with opposing ends of the wire coil.

11. A current sensor comprising:
an open-loop current sensor element;
a Hall-effect sensor coupled to the open-loop current sensor element, the Hall-effect sensor configured to generate a first output based on operation of the open-loop current sensor element;
a coil current sensor element configured to generate a second output, wherein (i) the coil current sensor element comprises a pinboard and (ii) the pinboard comprises:
a holder configured to clamp around at least a portion of the coil current sensor element, wherein at least two surfaces of the holder are in contact with a wire coil, and
a pair of metal pins configured about the wire coil of the coil current sensor element; and
a circuit board coupled to the Hall-effect sensor at a first location and coupled to the coil current sensor element via the pair of metal pins at a second location, the circuit board configured to generate a digital output based on at least one of the first output and the second output, wherein (i) the first location is positioned in a first quadrant while the second location is positioned in a second quadrant, and (ii) the first quadrant is different from the second quadrant in a cartesian plane.

12. The current sensor of claim 11 wherein the first location comprises at least a 90° angle of rotation away from the second location.

13. The current sensor of claim 11 wherein the holder comprises a fixture that maintains at least the wire coil in a fixed position within a housing.

14. The current sensor of claim 11 wherein the holder further comprises a clamp.

15. The current sensor of claim 11 wherein the digital output comprises a current reading corresponding to at least one of the first output and the second output.

16. The current sensor of claim 11 wherein the pair of metal pins comprise contacts configured for contacting with opposing ends of the wire coil.

* * * * *